US006884718B2

(12) United States Patent
Basceri

(10) Patent No.: US 6,884,718 B2
(45) Date of Patent: Apr. 26, 2005

(54) SEMICONDUCTOR MANUFACTURING PROCESS AND APPARATUS FOR MODIFYING IN-FILM STRESS OF THIN FILMS, AND PRODUCT FORMED THEREBY

(75) Inventor: Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 10/391,876

(22) Filed: Mar. 18, 2003

(65) Prior Publication Data

US 2004/0195606 A1 Oct. 7, 2004

(51) Int. Cl.[7] ................................................ H01L 21/44

(52) U.S. Cl. .................... 438/677; 438/457; 438/685; 438/782; 438/785; 438/917

(58) Field of Search ........................... 438/457, 677, 438/685, 782, 785, 974, FOR 119

(56) References Cited

U.S. PATENT DOCUMENTS

| | | | | |
|---|---|---|---|---|
| 3,808,674 A | * | 5/1974 | Francombe et al. | .......... 117/94 |
| 3,856,647 A | | 12/1974 | Blachman | |
| 4,830,984 A | | 5/1989 | Purdes | |
| 4,874,438 A | | 10/1989 | Oshita et al. | |
| 5,893,760 A | | 4/1999 | Mikata et al. | |
| 6,156,623 A | * | 12/2000 | Hendrix et al. | ............. 438/457 |
| 6,500,759 B1 | * | 12/2002 | Asakawa | .................... 438/683 |
| 6,514,835 B1 | | 2/2003 | Hendrix et al. | |
| 6,585,876 B2 | * | 7/2003 | Dordi et al. | ................. 205/148 |

FOREIGN PATENT DOCUMENTS

JP 01059809 A * 3/1989 ......... H01L/21/205

OTHER PUBLICATIONS

Roman et al., "Process Characterization of LPCVD Silicon Nitride and the Consequential Fabrication of Low Stress Microcantilevers", pp. 28–29.
Suo et al., "Mechanics of Rollable and Foldable Film–On–Foil Electronics", 1999, pp. 1177–1179, vol. 74, Issue 8, American Institute of Physics.
Bass et al., "Effects of Substrate Preparation on the Stress of Nb Thin Films", 2002.
Liu et al., "Response of a Strained Semiconductor Structure", 2002, pp 498, vol. 416, www.nature.com.
Uhm et al., "The Characteristics of TiN Films Deposited by Cyclic Chemical Vapor Deposition", Journal of the Korean Physical Society, 1999, pp. S765–S768, vol. 35.
Roh et al., "Diffusion Barrier Characteristics of Hf(C,N) Thin Films Deposited by Plasma Enhanced Metal Organic Chemical Vapor Deposition for Cu Metallization", 1998, pp 406–408, vol. 37 Publication Board Japanese Journal of Applied Physics.
Kourtev et al., "Influence of Deposition Conditions on the Intrinsic Mechanical Stress in Ion Plated DLC Thin Films", 2001, vol. 4, Academic Open Internet Journal, www.acad-journal.com.

* cited by examiner

Primary Examiner—Tom Thomas
Assistant Examiner—Matthew E. Warren
(74) Attorney, Agent, or Firm—Dinsmore & Shohl LLP

(57) ABSTRACT

An apparatus and process for depositing a barrier film on a substrate is disclosed. In particular, deposition of the barrier film is carried out on the substrate having an applied pressure. This applied pressure flexes the substrate to reduce in-plane stresses, wherein removal of the applied pressure after deposition of the barrier film modifies the in-film stress for the thin-film. With the above-described arrangement, it is possible to minimize the deterioration of electric characteristics of a semiconductor device and the occurrence of defects, such as film delamination, substrate cracks, and the like.

19 Claims, 4 Drawing Sheets

SEMICONDUCTOR MANUFACTURING PROCESS AND APPARATUS FOR MODIFYING IN-FILM STRESS OF THIN FILMS, AND PRODUCT FORMED THEREBY

FIELD OF THE INVENTION

The present invention relates to methods of controlling in-film stress in thin films of the type used in semiconductor fabrication, and, more particularly, to a method of controlling the state and amount of in-film stress of a barrier material provided on a semiconductor substrate.

BACKGROUND OF THE INVENTION

In many areas of semiconductor processing, it is often necessary to provide consecutive layers of materials that are not stable in contact with each other. For example, aluminum (Al) reacts with silicon at a few hundred ° C. to form "spikes" of an eutectic alloy which can penetrate into the silicon through the source or drain layer causing shorts to the body if a direct Al—Si contact is made. Additionally, silicon (Si) must also be protected during tungsten deposition, as the copious amounts of fluorine present will combine with hydrogen to form hydrofluoric acid (HF), which can attack silicon or silicon dioxide to form "wormholes" under the tungsten layer. Furthermore, copper (Cu) used in IC metallization must not encounter silicon dioxide passivants, as Cu+ ions will diffuse readily through the oxide and contaminate the underlying silicon.

In all the above cases and more, the situation is rescued by employing barrier materials, which are typically metals or nitrides of such metals in most applications that conduct electricity but do not permit interdiffusion and reactions of neighboring materials. However, certain barrier materials exhibit tensile or compressive stress when deposited as a thin film. In some cases, stress will build up because of the processing conditions, thermal expansion, or the mismatch of various characteristics of neighboring materials. As an example, low-Cl and low resistivity TiN films (TiCl4-based) exhibit very high in-film tensile stress when deposited on a silicon substrate.

The conventional method of depositing such thin films includes continuous deposition of a barrier material onto a semiconductor substrate until the desired thickness has been attained. The prior art continuous deposition method results in a structure as seen in prior art FIG. 1: a thin film of the barrier material 10, deposited onto a semiconductor substrate 12. When the thin barrier film made using the prior art process consists of TiN, for example, the thin barrier film 10 after heat treatment exerts a tensile stress 14 on the underlying substrate 12. The force exerted in compressive stress 16 by the substrate 12 is equal and opposite in directionality to the tensile stress 14 of the thin barrier film 10.

If the magnitude of the in-film tensile stress is sufficient, the thin barrier film 10 may crack, buckle, delaminate or pull away from the surface of the substrate 12, or even cause stress-related breakage of metal interconnects limiting applications of the used barrier material. This in-film stress also limits the thickness of such thin barrier films in applications because thicker films have more potential energy to crack and peel. Additionally, high stress levels in such thin barrier films can affect many material properties such as dielectric constant and crystallographic orientation. These damaging effects may occur during the course of the integrated circuit manufacturing process, or at any time throughout the useful lifetime of the integrated circuit device, resulting in yield loss and seriously affecting the reliability of the product seriously.

It would be, therefore, desirable to provide a method of depositing thin barrier films on semiconductor substrates in a manner that addresses in-film stress such that the thin barrier films exhibit reduced tensile or compressive stress following deposition.

SUMMARY OF THE INVENTION

The present invention addresses the above need by providing a method of depositing a thin film of a barrier material on a substrate so that the thin barrier film has a reduced amount of in-film stress. By reducing the amount of stress in the thin barrier film, cracking and delamination of barrier film from the semiconductor device may be addressed.

In one embodiment, provided is a method of modifying in-film stress of a thin barrier film comprising preloading a substrate with a preloaded stress, depositing a barrier material as a thin film on the substrate, and unloading the preloaded stress applied to the substrate.

In another embodiment, a method for fabricating a thin-film structure body is provided. The method comprises flexing a semiconductor substrate, depositing a thin film of a barrier material on the flexed semiconductor substrate, and unflexing the substrate.

In still another embodiment, a method for fabricating a thin-film structure body is provided. The method comprises providing a substrate to a sample holder, flexing the substrate to preload the substrate with tensile stress, depositing a barrier material on the flexed substrate, and unflexing the substrate.

In still another embodiment, a method for fabricating a thin-film structure body is provided. The method comprises providing a substrate to a sample holder, flexing the substrate to preload the substrate with compressive stress, depositing a barrier material on the flexed substrate, and unflexing the substrate.

In yet another embodiment, a method of modifying in-film stress of a thin barrier film is provided. The method comprises providing a substrate to a sample holder, raising a pin to flex the substrate to preload the substrate with a predetermined tensile stress, depositing a barrier material as a thin film on the substrate, and lowering the pin to unload the tensile stress applied to the substrate.

In still yet another embodiment, a method of modifying in-film stress of a thin barrier film is provided. The method comprises providing a substrate to a sample holder, raising a pin to flex the substrate to preload the substrate with a predetermined compressive stress, depositing a barrier material as a thin film on the substrate, and lowering the pin to unload the compressive stress applied to the substrate.

In another embodiment, a method for fabricating a thin-film structure body is provided. The comprises mounting a substrate by clips to a sample holder, situating the sample holder in a deposition chamber, pumping the deposition chamber to a base pressure, gradually heating the substrate to a desired temperature, and raising a pin to flex the substrate to preload the substrate with tensile stress. The method further includes depositing a barrier material on the flexed substrate, and lowering the pin to unflex the substrate.

In another embodiment, a method for fabricating a thin-film structure body is provided. The comprises mounting a substrate by clips to a sample holder, situating the sample holder in a deposition chamber, pumping the deposition chamber to a base pressure, gradually heating the substrate to a desired temperature, and applying a vacuum to flex the substrate to preload the substrate with compressive stress. The method further includes depositing a barrier material on the flexed substrate, and removing the vacuum to unflex the substrate.

In still another embodiment, an apparatus for manufacturing a semiconductor device and for carrying out a process of depositing barrier materials so as to form deposited thin barrier films having a modified in-film stress is provided. The apparatus comprises a chamber in which a semiconductor substrate can be contained, a sample holder adapted to support the semiconductor substrate within the chamber, and a tool for flexing the semiconductor substrate when supported by the sample holder.

In another embodiment provided is a method of forming a DRAM cell. The method comprises providing a substrate having CMOS structures to a sample holder, situating said sample holder in a deposition chamber, flexing the substrate, depositing a thin film of a barrier material on the flexed substrate, and unflexing the substrate.

In another embodiment, provided is a memory device structure comprising a semiconductor substrate having a lightly doped P-type crystal silicon substrate, and having field oxide areas and drain regions and source regions. The memory device structure further includes transistor gate members, including a wordline bounded by insulative material, formed on the surface of the semiconductor substrate, and a barrier film which was disposed over the semiconductor substrate when preloaded with a tensile stress.

In another embodiment, provided is a memory device structure comprising a semiconductor substrate having a lightly doped P-type crystal silicon substrate, and having field oxide areas and drain regions and source regions. The memory device structure further includes transistor gate members, including a wordline bounded by insulative material, formed on the surface of the semiconductor substrate, and a barrier film which was disposed over the semiconductor substrate when preloaded with a compressive stress.

In still another embodiment, provided is a DRAM cell comprising a semiconductor substrate having a lightly doped P-type crystal silicon substrate, and having field oxide areas and drain regions and source regions. The DRAM cell further includes transistor gate members, including a wordline bounded by insulative material, formed on the surface of the semiconductor substrate, and a barrier film which was disposed over the semiconductor substrate, the thick field oxide areas, and the transistor gate members when preloaded with a tensile stress. The barrier film has bitline contacts contacting the source regions for electrical communication with a bitline, and, further, has capacitor contacts contacting the drain regions for electrical communication with capacitors.

In still another embodiment, provided is a DRAM cell comprising a semiconductor substrate having a lightly doped P-type crystal silicon substrate, and having field oxide areas and drain regions and source regions. The DRAM cell further includes transistor gate members, including a wordline bounded by insulative material, formed on the surface of the semiconductor substrate, and a barrier film which was disposed over the semiconductor substrate, the thick field oxide areas, and the transistor gate members when preloaded with a compressive stress. The barrier film has bitline contacts contacting the source regions for electrical communication with a bitline, and, further, has capacitor contacts contacting the drain regions for electrical communication with capacitors.

These and other features and objects of the present invention will be apparent in light of the description of the invention embodied herein.

Figure 1:
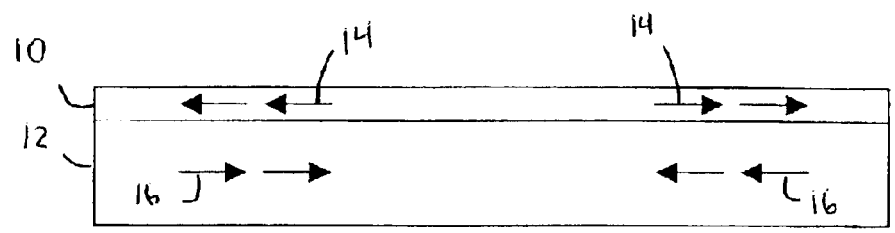
FIG. 1 is an enlarged schematic cross-sectional view of a portion of a prior art semiconductive structure.

In the drawings, the thicknesses of the various layers of material have been modified for clarity of illustration and are not necessarily true to scale.

DETAILED DESCRIPTION OF THE INVENTION

For purposes of the invention, the term "thick barrier film" will be understood to mean a layer of barrier material, which has a thickness greater than or equal to 5000 Å.

For purposes of the invention, the term "thin barrier film" will be understood to mean a layer of barrier material, which has a thickness less than 5000 Å.

For purposes of the invention, suitable materials for the barrier film are any materials which conduct electricity but do not permit inter-diffusion and reactions of neighboring films, and which possess properties of a low electrical resistivity, high melting point, thermal stability, and good adhesion properties. Such barrier films include, for example, Ti, TiW, TiN, TaN, Ta-based materials, WN, MoN, AlN, CrN, ScN, and any other barrier metal and metal alloy films suitable for the intended application.

For the purposes of this invention, a semiconductor substrate may comprise a silicon wafer, optionally with various components formed therein, including active devices, dielectric layers, barrier layers, underlying metal lines, oxide-filled barrier trenches, and the like.

Referring to FIGS. 2–5, one embodiment of the invention provides a method of modifying in-film (intrinsic) stress for thin barrier films deposited on a surface 20 of a substrate 22, such that thicker barrier films than that found in the prior art may be employed without having the negative effect of increased in-film stress.

Figure 2:
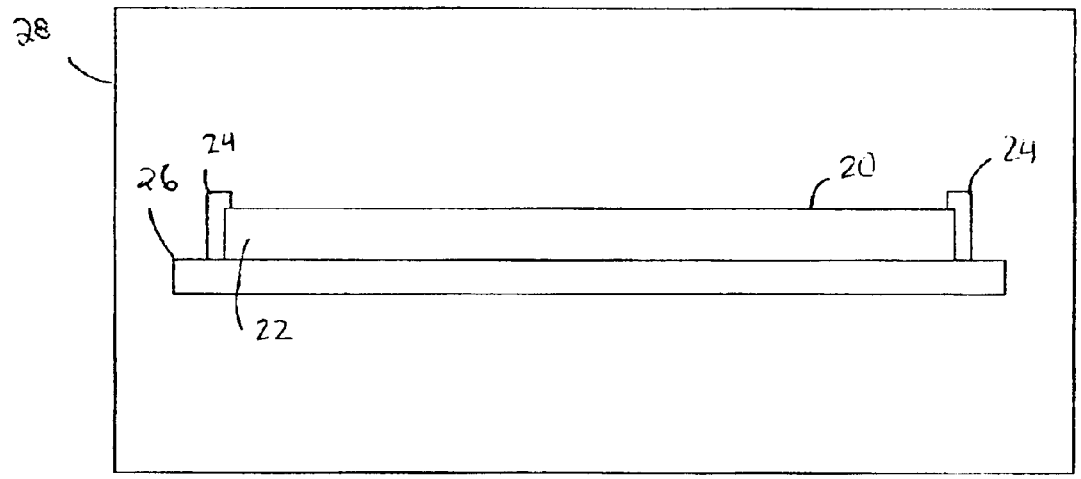
FIGS. 2–5 illustrate process steps according an embodiment of the present invention, and depict cross-sectional views of a portion of a semiconductor substrate having a thin barrier film deposited thereon.

As illustrated in FIG. 2, substrate 22 is mounted by clips 24 to a sample holder 26, which is then situated in a deposition chamber 28. It is assumed for the purposes of this discussion that substrate 22 has no intrinsic stress from prior processes, and is generally flat. The deposition chamber 28 is then pumped to a base pressure prior to deposition, such as for example, between about 1 to about 10 Torr. Prior to deposition, substrate 22 is gradually heated to a desired temperature, such as for example, between about 250° C. to about 700° C., and may be cleaned if desired by conventional cleaning processes, such as for example, sputtering.

Figure 3:
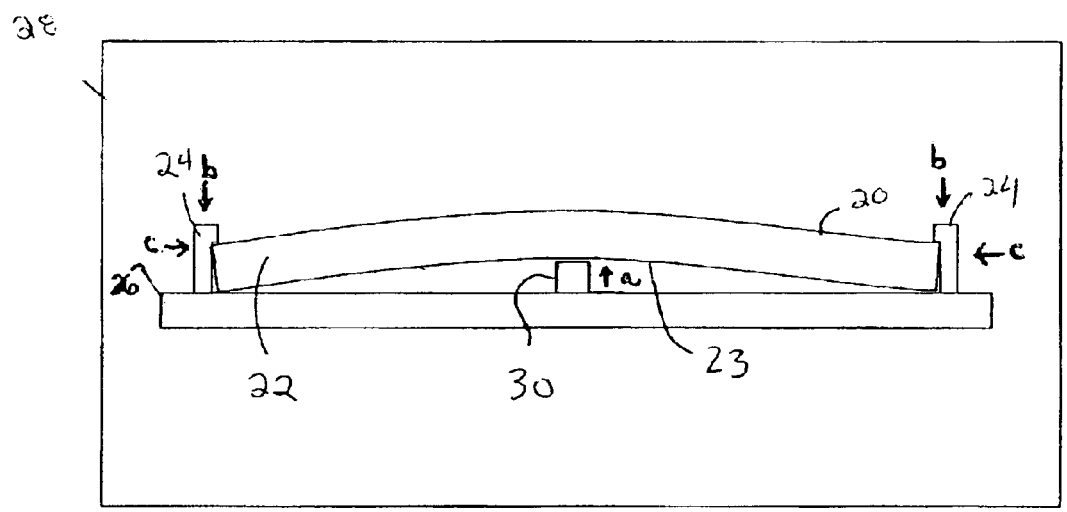

In FIG. 3, substrate 22 is then warped or flexed into a convex configuration, such as by a retractable pin 30 engaging the undersurface 23 of substrate 22 and being raised in the direction indicated by symbol a. Substrate 22 may be warped or flexed by a number of alternative methods such saddling substrate 22 over pin 30 and lowering clips 24 in the direction indicated by symbol b, by squeezing clips 24 together in the direction indicated by symbol c, or any other means which applies a pressure to deform substrate 22 into a convex configuration to preload tensile stress. The flexing of substrate 22 induces tensile stress, thereby reducing the resulting intrinsic compressive stress realized after depositing a thin barrier film. The range of the preloaded tensile stress is from about 10% to about 200%, and the actual amount of the preloaded tensile stress depends on the intended barrier layer material and desired thickness of the film.

Figure 4:
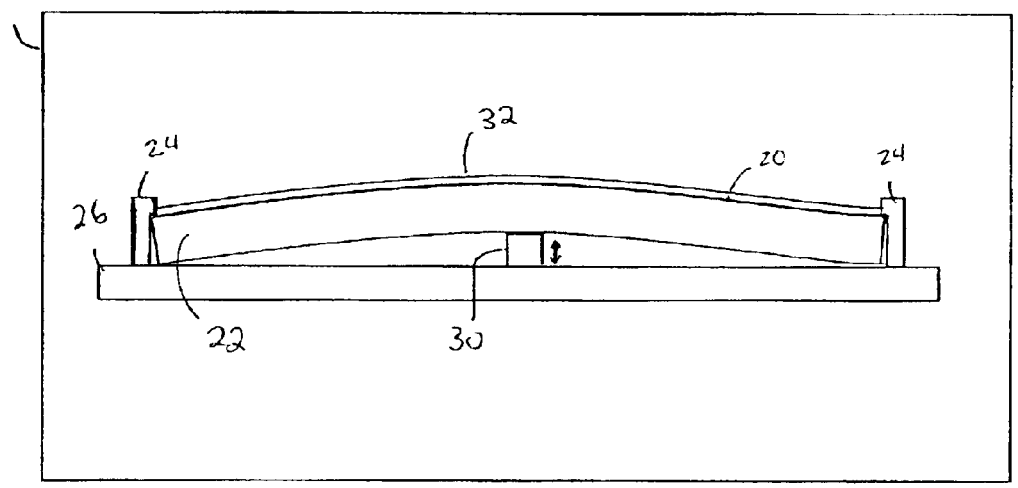

With substrate 22 flexed into a convex configuration illustrated in FIG. 4, a thin barrier film 32 is then provided over surface 20 of substrate 22. The thin barrier film 32 may be provided using any conventional deposition method, such as by reactive ion sputtering, electron beam evaporation, physical vapor deposition (PVD), chemical vapor deposition (CVD), atomic layer chemical vapor deposition (AL-CVD), and ion-beam assisted deposition (IAD) techniques. The method may also be used to grow a monolayer of the thin barrier film 32 on surface 20. Regardless of the technique used for depositing the thin barrier film 32, it is important the deposited layer(s) adhere securely to one another and/or to substrate 22, as the case may be.

Figure 5:
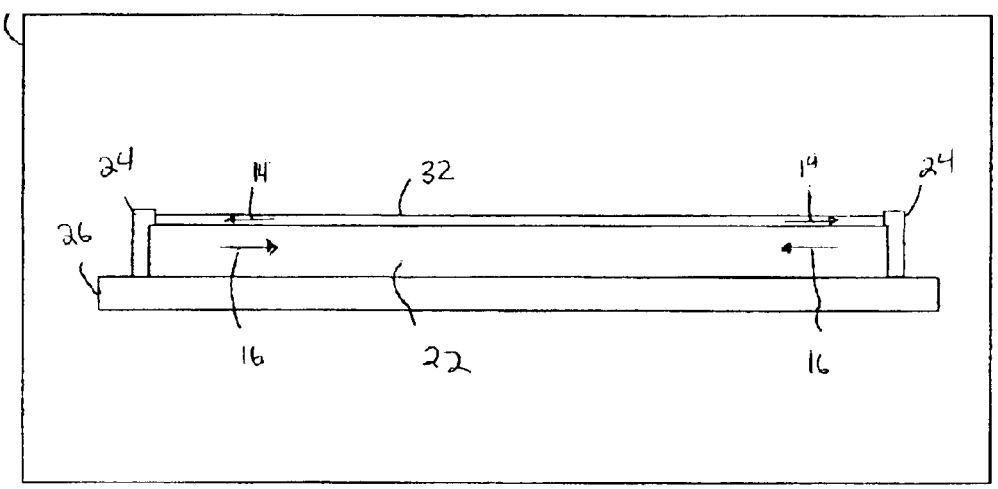

As illustrated by FIG. 5, because of the preloading of tensile stress within substrate 22 prior to deposition and crystallization of the thin barrier film 32, the level of stress in the thin barrier film 32 is reduced, or, in some cases, the state of the stress in the layer is changed. The state and level of stress in the thin barrier film 32 after deposition varies primarily as a function of preloading of tensile stress on substrate 22 and the composition and thickness of the thin barrier film 32. Thus, by appropriate selection of the amount of preloaded tensile stress for substrate 22 and materials for the thin barrier film 32, and by depositing the barrier film to an appropriate thickness, the state and level of stress in the film may be controlled.

In another embodiment, the substrate 22 may be warped or flexed into a concave configuration, such as by raising clips 24 in the direction indicated by symbol d, applying a vacuum to engage the undersurface 23 of substrate 22, such as through retractable pin 30, and lowering pin 30 in the direction indicated by symbol e. Substrate 22 may be warped or flexed by any other means which applies a pressure to deform substrate 22 into a concave configuration to preload a compressive stress. The range of the preloaded compressive stress is from about 10% to about 200%, and the actual amount of the preloaded compressive stress depends on the intended barrier layer material and desired thickness of the film.

Figure 7:
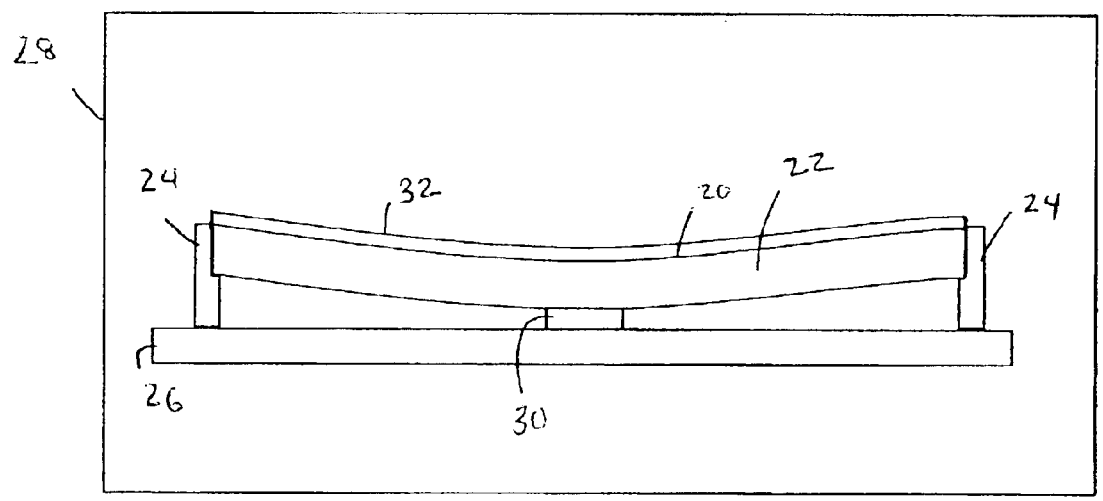

Such flexing of substrate 22 induces compressive stress, thereby reducing the resulting intrinsic tensile stress realized after depositing the thin barrier film 32, as illustrated by FIG. 7. Preloading the substrate before deposition of the thin barrier film helps to reduce the amount of in-film stress of barrier material which exhibits very-high in-film compressive stress when deposited on a substrate without a preloaded stress. As before, the thin barrier film 32 may be provided using any conventional deposition method, such as by reactive ion sputtering, electron beam evaporation, physical vapor deposition (PVD), chemical vapor deposition (CVD), atomic layer chemical vapor deposition (AL-CVD), and ion-beam assisted deposition (IAD) techniques. The method may also be used to grow a monolayer of the thin barrier film 32 on surface 20. Regardless of the technique used for depositing the thin barrier film 32, it is important the deposited layer(s) adhere securely to one another and/or to substrate 22, as the case may be.

Resulting stress after the deposition method of the present invention may be computationally determined. As is known, the mechanical stress is a force in the plane of film 32 acting per unit area of the film cross section. The mechanical stress may be compressive or tensile in character. The total mechanical stress s of a thin barrier film 32 consists of two terms:

$$s = s_i + s_T \quad (1)$$

where $s_i$ is intrinsic stress, which is a fundamental result of the conditions and method of film growth and is to a large degree a reflection of the film structure and the presence of impurities. Intrinsic stress $s_i$ is calculated by the expression $$s_i = [E_s/6(1-n_s)](d_s^2/d_f)(1/R_s - 1/R_f) \quad (2)$$

where $E_s$ and $n_s$ are respectively the Young's modulus and Poisson ratio of the substrate, $d_s$ and $d_f$ are respectively the substrate and the film thickness, and $R_s$ and $R_f$ are, respectively, the radii of curvature of the substrate without and with the barrier film. The thin barrier film thickness $d_f$ can be measured by profilometric measurements of film steps obtained using appropriate film masks on each sample.

The thermal stress $s_T$ in the barrier film is calculated by the expression:

$$s_T = [E_f/(1-n_f)](a_f - a_s)(T_d - T_M) \quad (3)$$

where $E_f$ and $n_f$ are respectively the Young's modulus and Poisson ratio for the film, $a_f$ and $a_s$ are average thermal coefficients of the film and the substrate, and $T_d$ and $T_M$ are the film deposition temperature and the temperature during the stress measurements, respectively. Accordingly, the amount of flexing of the substrate before deposition of the barrier material can be derived from the above equations in order to give a desired in-film stress level (tensile or compressive).

Alternatively, the in-film stress of film barrier film 32 may be determined based on empirical testing. Such testing involves depositing the barrier film 32 at a range of different thicknesses and substrate flexing, and then measuring the in-film stress levels of the barrier film 32 using, for instance, known reflectivity-measuring techniques. By correlating the characteristics of layers 22 and 32 with the type (i.e., convex or concave) and extent of deformation after deposition of the barrier film, the deposition parameters, i.e., barrier film thickness and amount of substrate flexing, required to achieve a thin barrier film 32 that impart the desired in-film stress (tensile or compressive) in substrate 22 may be determined.

Figure 8:
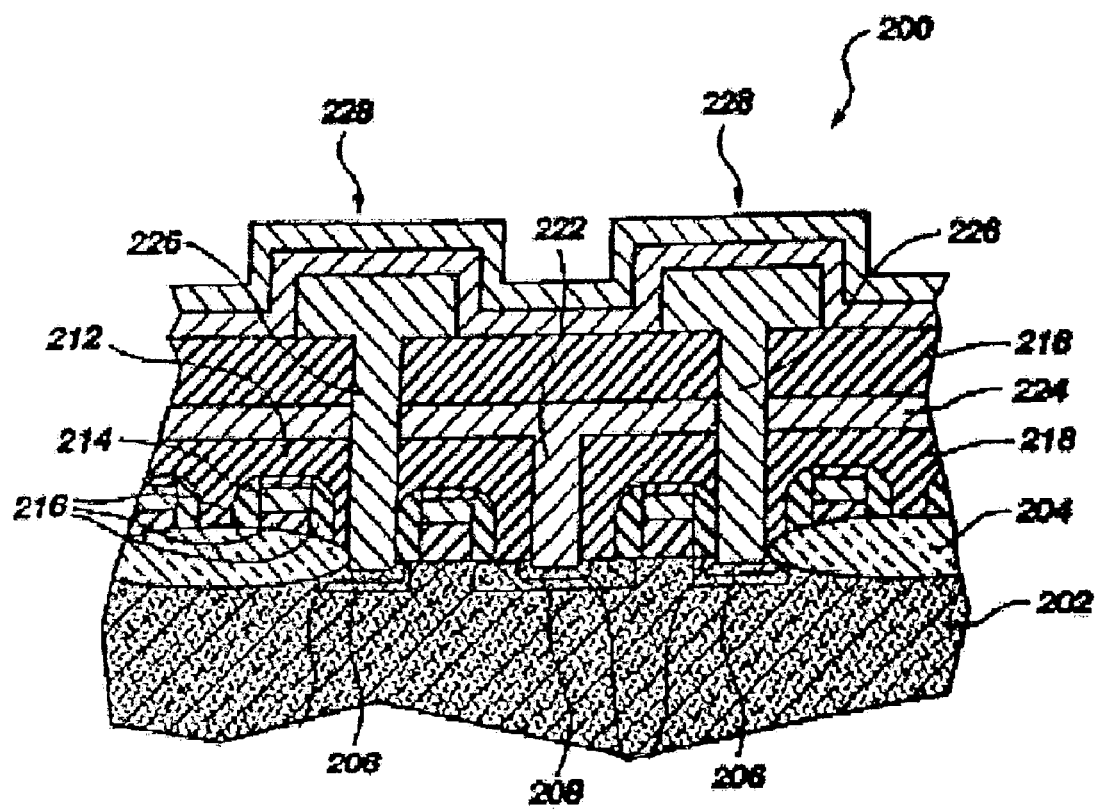
FIG. 8 is a schematic cross-sectional side view of a memory array of a DRAM chip formed by a method to reduce in-film stress according to an embodiment of the present invention.

The above-described method of controlling the state and level of in-film stress of thin barrier films deposited on a substrate may be used in the current generation DRAMs. Thus, when used in a DRAM, such as illustrated in FIG. 8, the thin barrier film is deposited in accordance with the deposition techniques discussed above. The stress in such DRAMs may be precisely controlled, as also discussed above. By controlling such in-film stress, the formation of dislocations in the substrate adjacent the barrier layer may be reduced significantly. Because such dislocations apparently provide pathways through which ions may diffuse and charge may leak, by reducing the formation of dislocations, it is believed that the reliability and retention time of the associated DRAM will increase.

Figure 6:
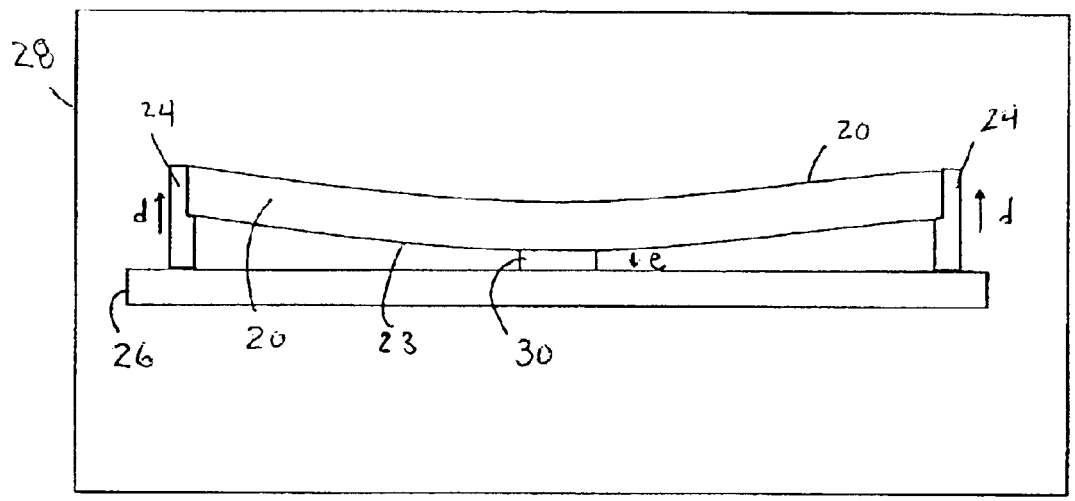
FIGS. 6–7 illustrate process steps according another embodiment of the present invention, and depict cross-sectional views of a portion of a semiconductor substrate having a thin barrier film deposited thereon.

For example, a CMOS structure 200 is illustrated in FIG. 6 as a portion of a memory array in a DRAM chip. The CMOS structure 200 comprises a semiconductor substrate 202, such as a lightly doped P-type crystal silicon substrate, which has been oxidized to form thick field oxide areas 204 and exposed to implantation processes to form drain regions 206 and source regions 208. Transistor gate members 212, including a wordline 214 bounded by insulative material 216, are formed on the surface of the semiconductor substrate 202. A barrier film 218 is disposed over the semiconductor substrate 202, the thick field oxide areas 204, and the transistor gate members 212 according to the present invention described above. The barrier film 218 has bitline contacts 222 contacting the source regions 208 for electrical communication with a bitline 224, and, further, has capacitor contacts 226 contacting the drain regions 206 for electrical communication with capacitors 228.

Having described the present invention in detail and by reference to the embodiments thereof, it will be apparent that modifications and variations are possible without departing from the scope of the invention in the following claims.

What is claimed is:

1. A method of modifying in-film stress of a thin barrier film, comprising:
    preloading a substrate with a predetermined stress;
    depositing a barrier material as a thin film on the substrate; and
    unloading the predetermined stress applied to the substrate,
    wherein said predetermined stress provides a mechanical stress s to said thin film, said mechanical stress being derived using the following equations:

$$s = s_i + s_T \quad (1)$$

where $s_i$ is intrinsic stress calculated by the expression:

$$s_i = [E_s/6(1-n_s)](d_s^2/d_f)(1/R_s - 1/R_f) \quad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \quad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

2. The method as recited by claim 1, wherein the substrate is flexed by a retractable pin engaging the undersurface of the substrate to preload the substrate with the predetermined stress.

3. The method as recited by claim 1, wherein the substrate is saddled over a pin and lowered to preload the substrate with a tensile stress.

4. The method as recited by claim 1, wherein the substrate is squeezed to flex the substrate in a convex manner to preload the substrate with a tensile stress.

5. The method as recited by claim 1, wherein the substrate is lowered by a vacuum to preload the substrate with a compressive stress.

6. The method as recited by claim 1, wherein the thin film is provided using a deposition method selected from the group consisting of reactive ion sputtering, electron beam evaporation, physical vapor deposition (PVD), chemical vapor deposition CVD), atomic layer chemical vapor deposition (AL-CVD), and ion-beam assisted deposition (IAD) techniques.

7. The method as recited by claim 1, wherein the thin film is selected from the group consisting of Ti, TiW, TiN, TaN, Ta-based materials, WN, MoN, AlN, CrN, SeN, barrier metals, and barrier metal alloys.

8. The method as recited by claim 1, wherein the thin film is provided by growing a monolayer of the barrier material on the substrate.

9. A method for fabricating a thin-film structure body, comprising:
    flexing a semiconductor substrate;
    depositing a thin film of a barrier material on the flexed semiconductor substrate; and
    unflexing the substrate, wherein said flexing said substrate provide a mechanical stress s to said thin film, said mechanical stress being derived using the following equations:

$$s = s_i + s_T \quad (1)$$

where $s_i$ is intrinsic stress calculated by the expression:

$$s_i = [E_s/6(1-n_s)](d_s^2/d_f)(1/R_s - 1/R_f) \quad (2)$$

where $E_s$ and $n_s$ are Young's modulus and Poisson ratio of said substrate, respectively, $d_s$ and $d_f$ thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \quad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

10. The method as recited by claim 9, wherein said substrate is fixed by applying a pressure to a surface of the substrate.

11. The method as recited by claim 9, wherein said flexing is carried out to preload a predetermined tensile stress.

12. The method as recited by claim 9, wherein said flexing is carried out to preload a predetermined compressive stress.

13. A method for fabricating a thin-film structure body, comprising:
    providing a substrate to a sample holder;
    flexing the substrate to preload the substrate with tensile stress;
    depositing a thin-film of a barrier material on the flexed substrate; and
    unflexing the substrate, wherein said tensile stress of the substrate provides a mechanical stress s to said thin film, said mechanical stress being derived using the following equations:

$$s = s_i + s_T \quad (1)$$

where $s_i$ is intrinsic stress calculated by the expression:

$$s_i = [E_s/6(1-n_s)](d_s^2/d_f)(1/R_s - 1/R_f) \qquad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \qquad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

14. A method for fabricating a thin film structure body, comprising:

providing a substrate to a sample holder:

flexing the substrate to preload the substrate with compressive stress;

depositing a thin film of a barrier material on the flexed substrate; and unflexing the substrate, wherein said compressive stress of the substrate provides a mechanical stress s to said thin film, said mechanical stress being derived using the following equations:

$$s = s_i + s_T \qquad (1)$$

where $s_i$ is intrinsic stress calculated by the expression:

$$s_i = [E_s/6(1-n_s)](d_s^2/d_f)(1/R_s - 1/R_f) \qquad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \qquad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

15. A method of modifying in-film stress of a thin barrier film, comprising:

providing a substrate to a sample holder;

raising a pin to flex the substrate to preload the substrate with a predetermined tensile stress;

depositing a barrier material as a thin film on the substrate; and lowering the pin to unload the tensile stress applied to the substrate, wherein said predetermined tensile stress of the substrate provides a mechanical stress s to said thin film, said mechanical stress being derived using the following equations:

$$s = s_i + s_T \qquad (1)$$

where $s_i$ is intrinsic stress calculated by the expression:

$$s_i = [E_s/6(1-n_s)](d_s^2/d_f)(1/R_s - 1/R_f) \qquad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \qquad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

16. A method of modifying in-film stress of a thin barrier film, comprising:

providing a substrate to a sample holder;

applying a vacuum to flex the substrate to preload the substrate with a predetermined compressive stress;

depositing a barrier material as a thin film on the substrate; and removing the vacuum to unload the compressive stress applied to the substrate, wherein said predetermined compressive stress of the substrate provides a mechanical stress s to said thin film, said mechanical stress being derived using the following equations:

$$s = s_i + s_T \qquad (1)$$

where $s_i$ is intrinsic stress calculated by the expression:

$$s_i = [E_s/6(1-n_s)](d_s^2/d_f)(1/R_s - 1/R_f) \qquad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \qquad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

17. A method for fabricating a thin-film structure body, comprising:

mounting a substrate by clips to a sample holder;

situating said sample holder in a deposition chamber;

pumping the deposition chamber to a predetermined base pressure;

heating the substrate to a desired temperature:

raising a pin to flex the substrate to preload the substrate with tensile stress;

depositing a thin film of a barrier material on the flexed substrate; and lowering the pin to unflex the substrate, wherein said tensile stress of the substrate provides a mechanical stress s to said thin film, turn said mechanical stress being derive using the following equations:

$$s = s_i + s_T \quad (1)$$

where $s_i$ is intrinsic stress calculated by the expression:

$$s_i = [E_s/6(1-n_s)](d_s^2/d_f)(1/R_s - 1/R_f) \quad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \quad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

18. A method for fabricating a thin-film structure body, comprising:

mounting a substrate by clips to a sample holder;

situating said sample holder in a deposition chamber;

pumping the deposition chamber to a predetermined base pressure;

heating the substrate to a desired temperature;

applying a vacuum to flex the substrate to preload the substrate with compressive stress;

depositing a thin film of a barrier material on the flexed substrate; and removing the vacuum to unflex the substrate, wherein said compressive stress of the substrate provides a mechanical stress s to said thin film, said mechanical stress being derived using the following equations:

$$s = s_i + s_T \quad (1)$$

where $s_i$ is intrinsic stress calculated by the expression:

$$s_i = [E_s/6(1-n_s)](d_s^2/d_f)(1/R_s - 1/R_f) \quad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \quad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

19. A method of forming a DRAM cell, comprising:

providing a substrate having CMOS structures to a sample holder;

situating said sample holder in a deposition chamber;

flexing the substrate;

depositing a thin film of a barrier material on the flexed substrate; and unflexing the substrate, wherein said flexing the substrate provide a mechanical stress s to said thin film, said mechanical stress being derived using the following equations:

$$s = s_i + s_T \quad (1)$$

where $s_i$ is intrinsic stress calculated by the expression:

$$s_i = [E_s/6(1-n_s)](d_s^2/d_f)(1/R_s - 1/R_f) \quad (2)$$

where $E_s$ and $n_s$ are Young's modulus and Poisson ratio of said substrate, respectively, $d_s$ and $d_f$ are thickness of said substrate and said thin film, respectively, and $R_s$ and $R_f$ are radii of curvature of said substrate without and with said thin film, respectively, and where $s_T$ is thermal stress in said thin film calculated by the expression:

$$s_T = [E_f/(1-n_f)](a_f - a_s)(T_d - T_M) \quad (3)$$

where $E_f$ and $n_f$ are Young's modulus and Poisson ratio for said thin film, respectively, $a_f$ and $a_s$ are average thermal coefficients of said thin film and said substrate, and $T_d$ and $T_M$ are film deposition temperature and temperature during stress measurement, respectively.

* * * * *

UNITED STATES PATENT AND TRADEMARK OFFICE
CERTIFICATE OF CORRECTION

PATENT NO. : 6,884,718 B2  Page 1 of 1
DATED : March 18, 2003
INVENTOR(S) : Cem Basceri It is certified that error appears in the above-identified patent and that said Letters Patent is hereby corrected as shown below:

Column 8,
Line 47, "fixed" should read -- flexed --.

Column 9,
Line 22, "holder:" should read -- holder; --.

Signed and Sealed this

Eleventh Day of October, 2005

JON W. DUDAS
*Director of the United States Patent and Trademark Office*